United States Patent
Morris, III et al.

(10) Patent No.: US 10,546,695 B2
(45) Date of Patent: Jan. 28, 2020

(54) SYSTEMS AND METHODS FOR CALIBRATING A TUNABLE COMPONENT

(71) Applicant: Wispry Inc., Irvine, CA (US)

(72) Inventors: Arthur S. Morris, III, Raleigh, NC (US); Marten A. E. Seth, Dana Point, CA (US); Peter Good, Dana Point, CA (US); Steven Spencer Watkins, San Diego, CA (US)

(73) Assignee: WISPRY, INC., Irvine, CA (US)

( * ) Notice: Subject to any disclaimer, the term of this patent is extended or adjusted under 35 U.S.C. 154(b) by 633 days.

(21) Appl. No.: 14/537,489

(22) Filed: Nov. 10, 2014

(65) Prior Publication Data

US 2015/0131197 A1 May 14, 2015

Related U.S. Application Data

(60) Provisional application No. 61/901,911, filed on Nov. 8, 2013.

(51) Int. Cl.
*H01G 7/00* (2006.01)
(52) U.S. Cl.
CPC ..................... *H01G 7/00* (2013.01)
(58) Field of Classification Search
CPC ........................................... H01G 7/00
USPC .......................................... 361/277
See application file for complete search history.

(56) References Cited

U.S. PATENT DOCUMENTS

| | | |
|---|---|---|
| 2004/0246809 A1 | 12/2004 | Sutardja |
| 2004/0249592 A1 | 12/2004 | Koukol, Jr. et al. |
| 2006/0160510 A1 | 7/2006 | Seppinen et al. |
| 2007/0266350 A1 | 11/2007 | Fulga et al. |
| 2013/0160518 A1* | 6/2013 | Leneel ............... G01N 27/223 73/1.06 |
| 2013/0222075 A1* | 8/2013 | Reedy .................... H03J 3/20 333/32 |
| 2013/0226496 A1 | 8/2013 | Gudem et al. |
| 2013/0281032 A1 | 10/2013 | Manssen et al. |

FOREIGN PATENT DOCUMENTS

| | | |
|---|---|---|
| EP | 0314873 A1 | 5/1989 |
| EP | 1962421 A1 | 8/2008 |
| WO | WO 2015/070154 | 5/2015 |

OTHER PUBLICATIONS

IPRP and Written Opinion for Application No. PCT/US2014/064827 dated May 10, 2016.

(Continued)

*Primary Examiner* — Vongsavanh Sengdara
(74) *Attorney, Agent, or Firm* — Jenkins, Wilson, Taylor & Hunt, P.A.

(57) ABSTRACT

Systems, devices, and methods for adjusting tuning settings of tunable components, such as tunable capacitors, can be configured for calibrating a tunable component. Specifically, the systems, devices and methods can measure a device response for one or more inputs to a tunable component, store a calibration code in a non-volatile memory that characterizes the device response of the tunable component, and adjust a tuning setting of the tunable component based on the calibration code to achieve a desired response of the tunable component.

15 Claims, 5 Drawing Sheets

(56) References Cited

OTHER PUBLICATIONS

European Publication Notification for Application No. 14859825 (Publ. No. EP 3066666) dated Aug. 18, 2016.
International Search Report for Application No. PCT/US2014/064827 dated Jan. 28, 2015.
Extended European Search Report for Application No. 14859825 dated May 11, 2017.
Chinese Office Action for Application No. 201480061112.6 dated Mar. 4, 2019.

* cited by examiner

SYSTEMS AND METHODS FOR CALIBRATING A TUNABLE COMPONENT

PRIORITY CLAIM

The present application claims the benefit of U.S. Provisional Patent Application Ser. No. 61/901,911, filed Nov. 8, 2013, the disclosure of which is incorporated herein by reference in its entirety.

TECHNICAL FIELD

The subject matter disclosed herein relates generally to control of tunable components. More particularly, the subject matter disclosed herein relates to adjusting tuning settings of tunable components, such as tunable capacitors.

BACKGROUND

Programmable capacitors can be used for tuning the response of an electrical circuit by varying the capacitance value of the capacitor to correspondingly produce different behaviors. In many applications, the set value may need to be tightly controlled to meet system requirements and optimize overall performance. In general, however, although such capacitors are commonly built using a range of processes, all processes exhibit variations due to factors such as rates, chemistries, temperatures, and timing. As a result, substantially all programmable capacitors as built have a range of values (e.g., for maximum capacitance value, minimum capacitance value, capacitance step between set values). This range may be acceptable for some applications, but when a more precise response is required, it is desirable that variation in the capacitance values be minimized.

To address these issues, attempts have been made to reduce the variation in the manufacturing process, but raising performance standards generally requires either exerting more precise control over the production process or discarding components that fail to meet the higher standards. Both of these approaches increase the cost of producing the components. Alternatively, the capacitors can be designed to reduce the sensitivity of the device capacitance on the process variation, but doing so is not possible in all device configuration and/or applications. As a result, it would be desirable for the variation in the performance of devices to be reduced without dramatically increasing manufacturing costs or requiring component designs to be constrained to only those configurations that are less sensitive to process variability.

SUMMARY

In accordance with this disclosure, systems, devices, and methods for adjusting tuning settings of tunable components, such as tunable capacitors, are provided. In one aspect, a method for calibrating a tunable component is provided. The method can include measuring a device response for one or more inputs to a tunable component, storing a calibration code in a non-volatile memory that characterizes the device response of the tunable component, and adjusting a tuning setting of the tunable component based on the calibration code to achieve a desired response of the tunable component.

In another aspect, a tunable component is provided having one or more tunable elements and a non-volatile memory configured to store a calibration code that characterizes a device response of the one or more tunable elements.

Although some of the aspects of the subject matter disclosed herein have been stated hereinabove, and which are achieved in whole or in part by the presently disclosed subject matter, other aspects will become evident as the description proceeds when taken in connection with the accompanying drawings as best described hereinbelow.

BRIEF DESCRIPTION OF THE DRAWINGS

The features and advantages of the present subject matter will be more readily understood from the following detailed description which should be read in conjunction with the accompanying drawings that are given merely by way of explanatory and non-limiting example, and in which.

DETAILED DESCRIPTION

Rather than relying on controlling the production of the tunable devices to minimize the variation in performance and/or to minimize the impact of the variation, the present subject matter provides systems and methods that are designed to compensate for the variation through appropriate control. In this way, more precise device response values can be available, and higher yields can be achieved for a given tolerance.

Figure 1:
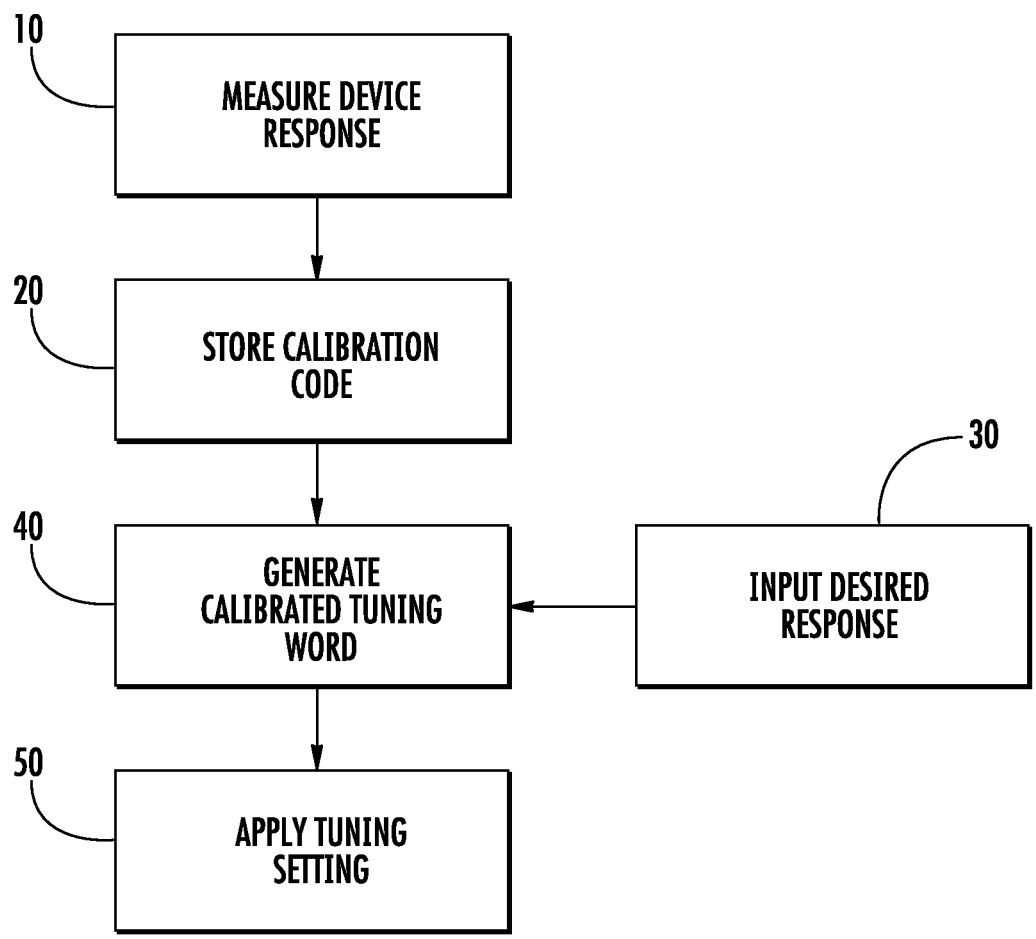
FIG. 1 is a flow chart illustrating a method for calibrating a tunable component according to an embodiment of the presently disclosed subject matter.

In this regard, in one aspect, the present subject matter provides a method for calibrating a tunable component, such as a tunable capacitor. As illustrated in FIG. 1, the performance of a given tunable device can be characterized in a measurement step 10. Specifically, measurement step 10 can comprise measuring a device response for one or more inputs to a tunable component. For example, for a tunable capacitor, measuring the device response can comprise measuring a capacitance at one or more tuning states. Such a measurement can be obtained at a final device test or in an application final test (e.g. filter response). Based on the measurement, the deviation from the nominal response can be noted. In particular, a calibration digital word that characterizes the device response of the tunable component can be written into a non-volatile memory on the device in a storing step 20.

Upon receiving an input 30 that identifies the desired response (e.g., the desired total capacitance), this calibration digital word can thereafter be used in a calibration step 40 to modify the tuning word that is applied to control the device. As will be discussed in further detail below, in some configurations, such modification can be performed externally from the device by reading the calibration digital word from the device and calculating the appropriate modified control word required for any desired tuned value. This calculation can be performed for an entire control table at system reset and/or it can be performed on-the-fly as required during operation. Alternatively, in some configurations, the compensation can be performed on the tunable device itself by modifying control words written to the device by the system using on-board circuits/logic.

In any configuration, the calibrated tuning word can be applied in a tuning step 50 to adjust a tuning setting of the tunable component based on the calibration code. In this way, a desired response of the tunable component can be achieved that compensates for the manufacturing variation and yields a more precisely tuned value.

Figure 2:
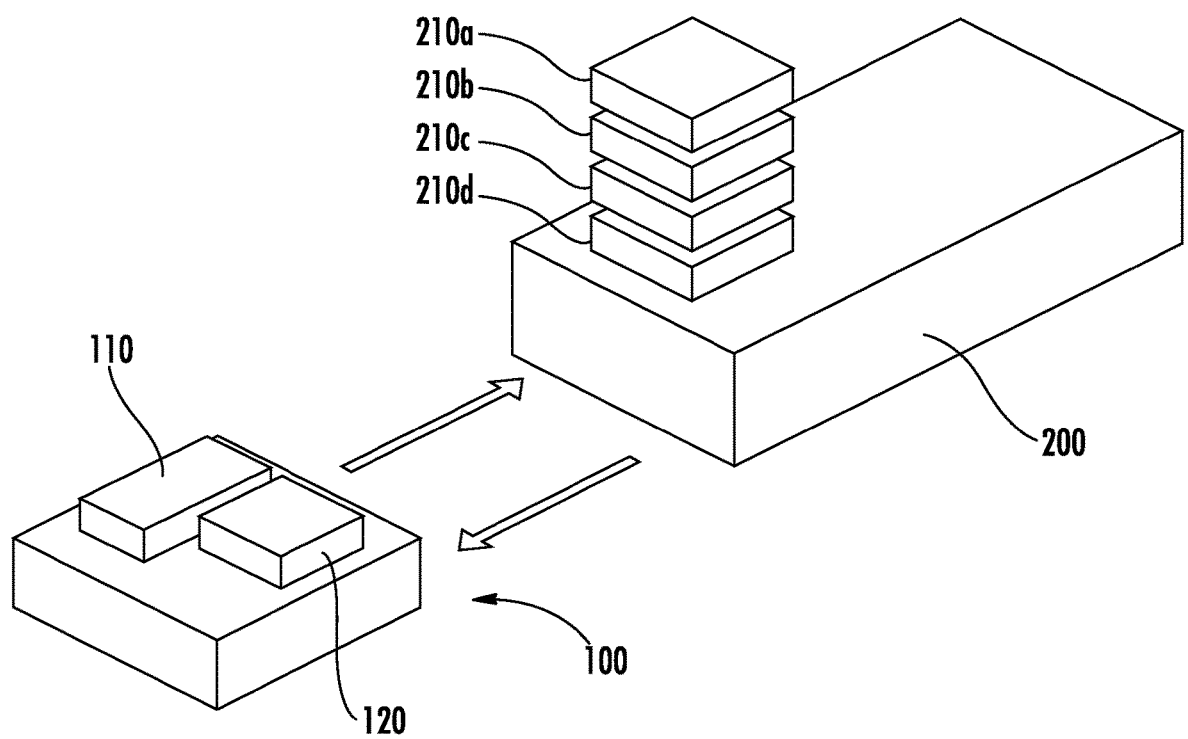
FIG. 2 is a schematic view of a tunable component according to an embodiment of the presently disclosed subject matter.

Within this general framework, the present subject matter can be implemented in any of a variety of configurations. In one embodiment shown in FIG. 2, for example, a tunable component, generally designated 100, can include one or more tunable elements and can be is configured to compensate for any variation in the performance of its tunable elements. In particular, for example, the one or more tunable elements can be one or more tunable capacitors. Tuning of the tunable elements can be achieved by applying a tuning word that is stored in a tuning word register 110. As discussed above, however, due to the variability in the performance of the tunable elements, calibration of the tuning word can be desirable such that a given desired output can be achieved.

In this regard, tunable component 100 can further include a non-volatile memory 120 configured to store one or more calibration code that characterizes a device response of the one or more tunable elements. Specifically, in some embodiments, the calibration code can comprise one of a plurality of "bin" identifiers that characterizes one or more of the tunable elements as exhibiting a device response that falls within one of a plurality of discrete device response ranges (e.g., less than 70% of the designed response for a given input, less than 80%, less than 90%, etc.). Accordingly, non-volatile memory 120 can be configured to store one of the plurality of bin identifiers associated with a discrete device response range of the tunable component. In some embodiments, an individual bin identifier can be selected to characterize a device response of each tunable element of the tunable component. Alternatively, in some embodiments, the bin identifier can be selected to characterize an aggregate device response of an array of tunable elements of the tunable component.

Regardless of how the bin identifier characterizes the device performance, tuning of tunable component 100 can involve communication with a driver 200 that is distinct from tunable component 100 (e.g., by way of a serial data link). Driver 200 can have access to a plurality of tuning word tables (e.g., first, second, third, and fourth tuning word tables 210a, 210b, 210c, and 210d shown in FIG. 2). In some embodiments, for example, the number of tuning words can be equal to an integer multiple of the number of bin identifiers (i.e., one or more tuning word for every bin)

Figure 3:
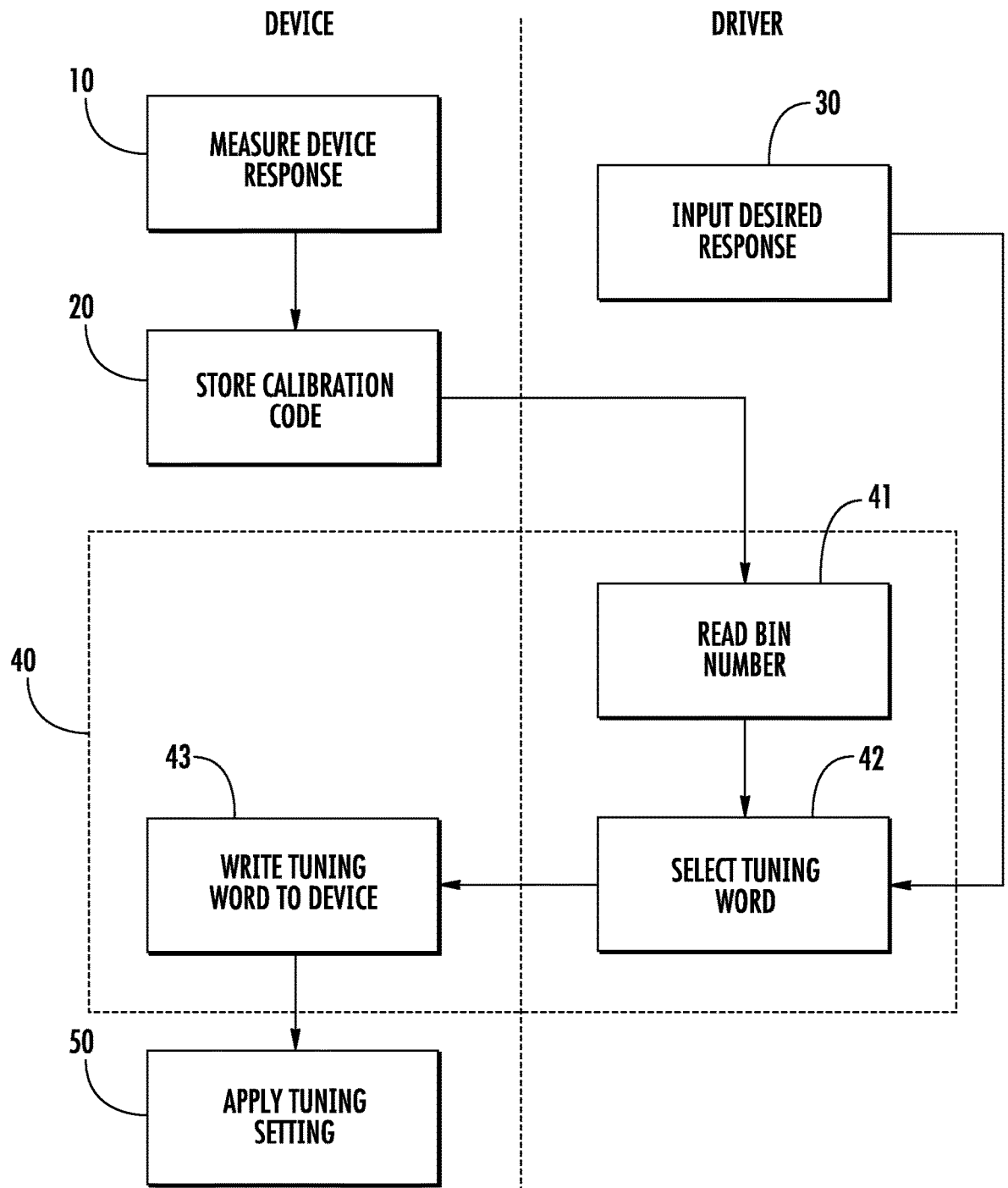
FIG. 3 is a flow chart illustrating a method for calibrating the tunable component shown in FIG. 2 according to an embodiment of the presently disclosed subject matter.

With this configuration for tunable component 100, the method for tuning tunable component 100 can be implemented as shown in FIG. 3. In particular, calibration step 40 can comprise reading the bin number from the storage on tunable component 100 in a bin retrieval step 41. Then, for a given input 30, a tuning word selection step 42 can comprise selecting one or more of a plurality of tuning words (e.g., selected from tuning word tables 210a, 210b, 210c, and 210d) corresponding to the stored one of the plurality of bin identifiers.

In this regard, the bin identifier can effectively be used as an index to filter within a tuning-word matrix. As shown in Table 1 below, for example, a portion of a tuning word matrix is provided in which the range of capacitance values achievable by a device are associated with both a bin identifier and a tuning word (e.g., identified as t-2.000 through t-3.000). In this way, once the matrix is filtered by the identified bin, a tuning word can be selected to achieve the desired output. For example, if a response of 2.000 is desired and the bin identifier is 80%, a tuning word of t-2.500 would be utilized. Note that the step size between tuning words and between bins may be product- and/or application-specific.

TABLE 1

|  | 120% bin | 100% bin | 80% bin | 70% bin |
| --- | --- | --- | --- | --- |
| t-3.000 | 3.600 | 3.000 | 2.400 | 2.100 |
| t-2.875 | 3.450 | 2.875 | 2.300 | 2.013 |
| t-2.750 | 3.300 | 2.750 | 2.200 | 1.925 |
| t-2.625 | 3.150 | 2.625 | 2.100 | 1.838 |
| t-2.500 | 3.000 | 2.500 | 2.000 | 1.750 |
| t-2.375 | 2.850 | 2.375 | 1.900 | 1.663 |
| t-2.250 | 2.700 | 2.250 | 1.800 | 1.575 |
| t-2.125 | 2.550 | 2.125 | 1.700 | 1.488 |
| t-2.000 | 2.400 | 2.000 | 1.600 | 1.400 |

In addition, the desired response can be controlled to be within the discrete device response range of the bin identifier having the smallest discrete device response range to maximize yield. Specifically, for example, for a device having a response range specification minimum that is 70% of a designed response range (i.e., 70% bin), the desired response can be selected to provide similar responses for other bins. As shown in Table 2 below, for example, settings for devices operating within the upper bin values can be backed off to achieve a total output that is as close as possible in value to the values achieved by a reference device operating in the 70% bin (e.g., within the limits of the resolution of the tuning steps available).

TABLE 2

| 120% bin | 100% bin | 80% bin | 70% bin |
| --- | --- | --- | --- |
| 3.600 → 2.100 | 3.000 → 2.125 | 2.400 → 2.100 | 2.100 |
| 3.450 → 1.950 | 2.875 → 2.000 | 2.300 → 2.000 | 2.013 |
| 3.300 → 1.950 | 2.750 → 1.875 | 2.200 → 1.900 | 1.925 |
| 3.150 → 1.800 | 2.625 → 1.875 | 2.100 → 1.800 | 1.838 |
| 3.000 → 1.800 | 2.500 → 1.750 | 2.000 → 1.800 | 1.750 |
| 2.850 → 1.650 | 2.375 → 1.625 | 1.900 → 1.700 | 1.663 |
| 2.700 → 1.650 | 2.250 → 1.625 | 1.800 → 1.600 | 1.575 |
| 2.550 → 1.500 | 2.125 → 1.500 | 1.700 → 1.500 | 1.488 |
| 2.400 → 1.350 | 2.000 → 1.375 | 1.600 → 1.400 | 1.400 |

In addition, the specific tuning word(s) used can be selected based on other variables in addition to the bin, which may be used in computing the desired tuning word, selection from a multi-dimensional selection matrix, or a combination of the two. For example, parameters such as a frequency or frequencies of operation, platform configurations, temperature, power level, data from sensors, or other variables can be considered in the selection of the tuning word (or words) to be used to achieve a desired output.

A subset of the full set of tuning words corresponding to the bin can be down-selected based on the bin identifier. This subset can be read during power up or in similar circumstances so that only the words that are of use would be in active memory for selection. In this way, the 'active' memory used during operation only needs to read in the row/column of a tuning word matrix that corresponds to the bin identifier at that initial stage. The rest can stay in long-term storage. This pre-selection of the relevant subset of a global tuning word matrix can save processor memory and time.

Figure 4:
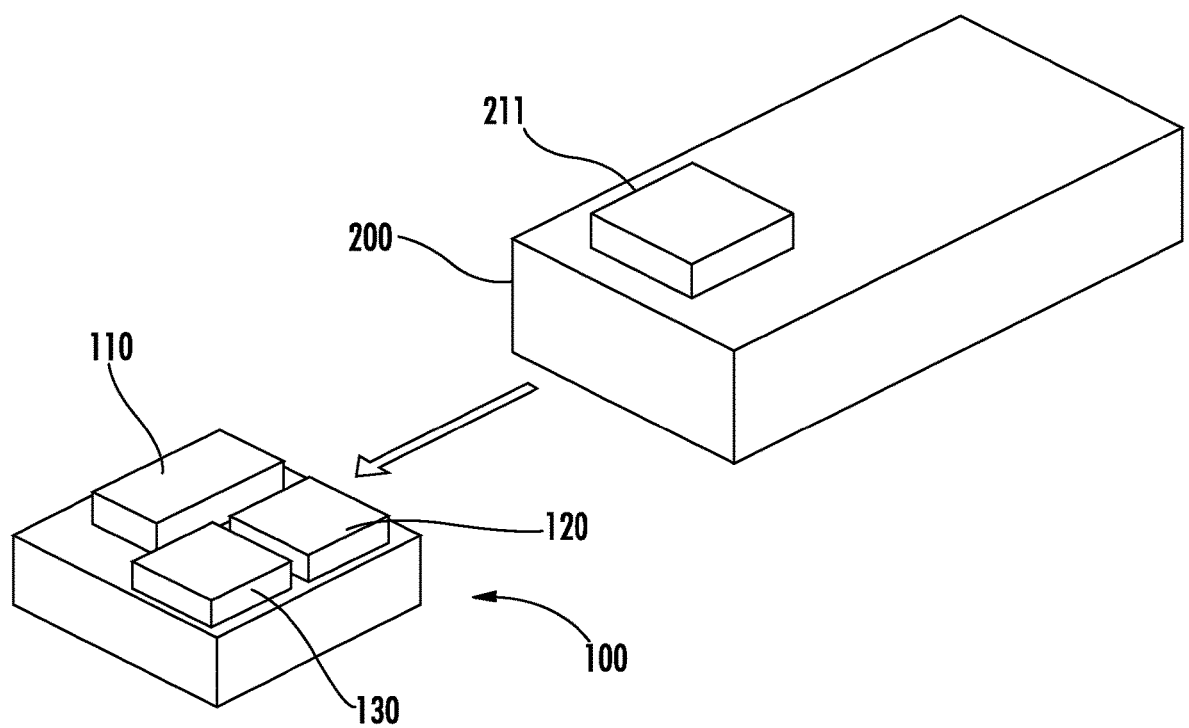
FIG. 4 is a schematic view of a tunable component according to an embodiment of the presently disclosed subject matter.

Alternatively, in another configuration shown in FIG. 4, tunable component 100 can be configured to perform on-chip recalibration of tuning words rather than having the tuning word adjustment done by driver 200. In this regard, tunable component 100 can further include a logic block 130 configured to generate a tuning word that is selected based on the calibration code to produce a response of the one or more tunable elements that substantially matches a desired response. In some embodiments, logic block 130 is included within logic of tunable component 100. In the configuration where the tunable elements are tunable capacitors, for example, logic block 130 can be configured to generate a tuning word that is selected to produce a total capacitance of the tunable capacitors that substantially matches a desired total capacitance. This off-loading of the turning word selection from driver 200 can allow for easier driver development and operation. In addition, customer engineering can be more easily designed during application development.

In some embodiments, non-volatile memory 120 can again be configured to store one of a plurality of bin identifiers as discussed above. In this configuration, however, logic block 130 can be used to select one or more of a plurality of tuning words corresponding to the stored one of the plurality of bin identifiers rather than driver 200. Alternatively, logic block 130 can be configured to receive a reference tuning word corresponding to the desired response, and logic block 130 can be configured to generate the tuning word that is selected to produce the response of the one or more tunable elements that substantially matches the desired response by modifying the reference tuning word based on the calibration code.

Specifically, in some embodiments, non-volatile memory 120 can be configured to store one or more coefficients of a calibration tuning function. For example, for a first-degree polynomial function $C=a \cdot C_1 + C_2$, where a is an element of a variable tuning input, the calibration code can define a set of coefficients $[C_1, C_2]$ that most closely maps the function C to the measured performance capabilities of tunable component 100. In addition, those having skill in the art will recognize that the function can also be a higher-order polynomial or a more complex function that models the device response for a given set of calibration coefficients.

Figure 5:
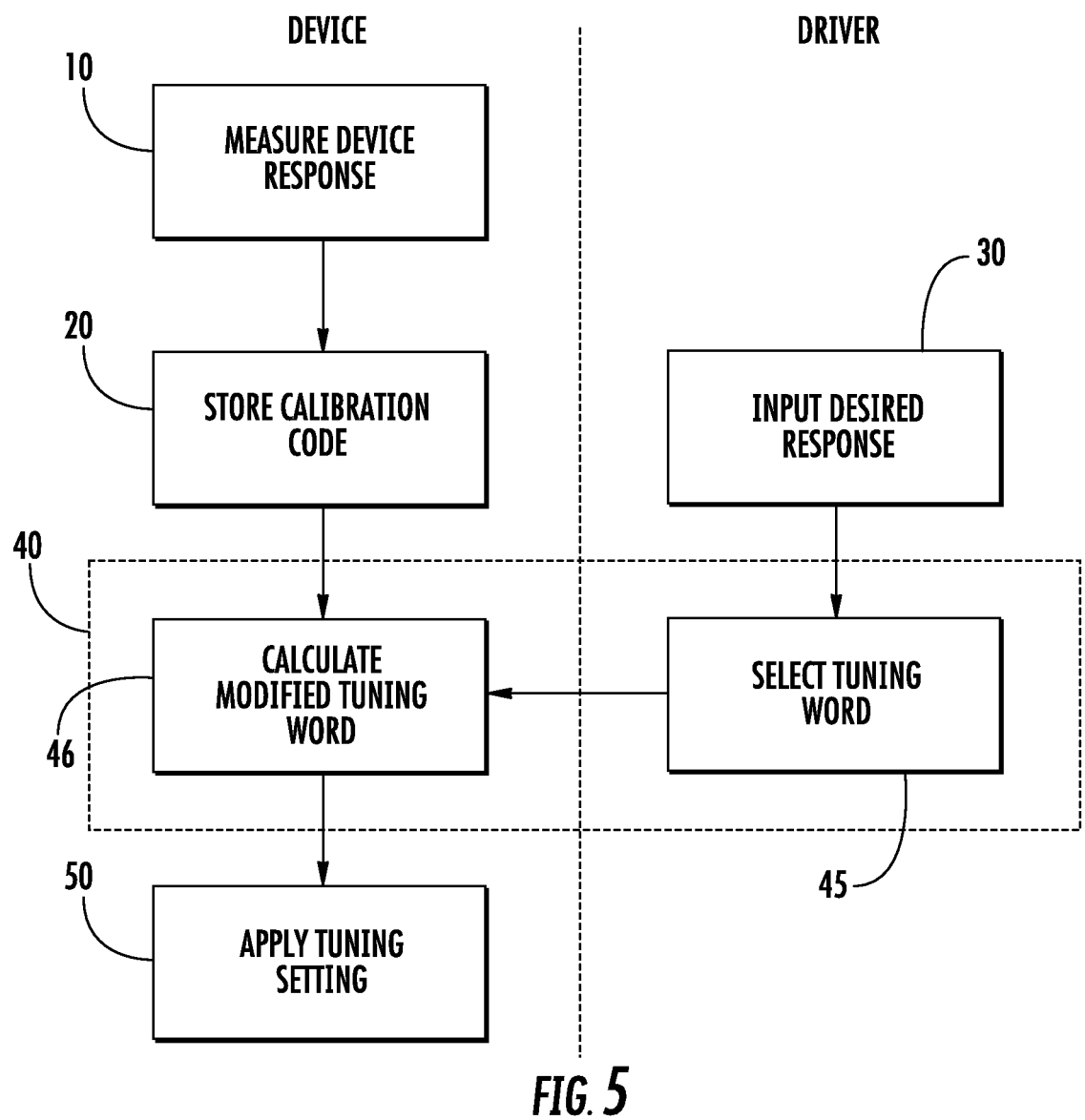
FIG. 5 is a flow chart illustrating a method for calibrating the tunable component shown in FIG. 4 according to an embodiment of the presently disclosed subject matter.

With this on-chip calibration configuration, adjusting a tuning setting can be performed as shown in FIG. 5. Specifically, for a given input 30, a baseline tuning word corresponding to the desired response can be communicated by driver 200 to tunable component 100 in an initial selection step 45. Tunable component 100 can then itself generate a modified tuning word in a calculation step 46 (e.g., at logic block 130) based on the calibration code to produce a response of the tunable component that substantially matches the desired response.

Furthermore, the operation of tunable component 100 can be designed such that the desired response has a first numerical resolution, but the response of tunable component 100 has a second numerical resolution that is finer than the first numerical resolution. For example, for a tunable capacitor array, the desired response can be configured to define values to the nearest 0.125 pF, whereas the tunable capacitor array can be configured to produce values to the nearest 0.0625 or 0.03125 pF. In this way, even though the device performance may deviate from the designed levels, fine adjustments can be made to get the performance very close to the desired values.

The present subject matter can be embodied in other forms without departure from the spirit and essential characteristics thereof. The embodiments described therefore are to be considered in all respects as illustrative and not restrictive. Although the present subject matter has been described in terms of certain preferred embodiments, other embodiments that are apparent to those of ordinary skill in the art are also within the scope of the present subject matter.

What is claimed is:

1. A method for calibrating a tunable component, the method comprising:
   measuring a capacitance of one or more tunable capacitors of a tunable component in response to a reference electrical tuning input;
   storing a calibration code in a non-volatile memory, wherein the non-volatile memory is provided on the tunable component, and wherein the calibration code characterizes a deviation of the capacitance of the tunable component relative to a desired response of the tunable component to the reference electrical tuning input;
   during operation of the tunable component, receiving an electrical tuning input as a tuning word corresponding to a desired total capacitance;
   generating a modified tuning word that is selected or computed based on the electrical tuning input and the calibration code to produce a tuned capacitance of the tunable component that most closely matches the desired total capacitance, wherein the modified tuning word is selected or computed by a logic block in communication with the non-volatile memory and the tunable component; and
   applying the modified tuning word to the tunable component to change the capacitance of the tunable component based on the calibration code to achieve the tuned capacitance of the tunable component.

2. The method of claim 1, wherein storing a calibration code comprises storing one of a plurality of bin identifiers that are each associated with a discrete device response range of the tunable component.

3. The method of claim 2, wherein the desired response is selected to be within the discrete device response range of the one of the plurality of bin identifiers having the smallest discrete device response range.

4. The method of claim 2, wherein the one of the plurality of bin identifiers is selected to characterize a device response of a single tunable capacitor of the tunable component.

5. The method of claim 2, wherein the one of the plurality of bin identifiers is selected to characterize an aggregate device response of an array of tunable capacitors of the tunable component.

6. The method of claim 2, wherein adjusting a tuning setting comprises:
   retrieving the one of the plurality of bin identifiers from the non-volatile memory;
   selecting one or more of a plurality of tuning words corresponding to the stored one of the plurality of bin identifiers; and
   applying the selected one or more of the plurality of tuning words to the tunable component.

7. The method of claim 6, wherein the number of tuning words is equal to an integer multiple of the number of bin identifiers.

8. The method of claim 1, wherein storing a calibration code comprises storing one or more coefficients of a calibration tuning function.

9. The method of claim 1, wherein the desired total capacitance has a first numerical resolution; and wherein the tuned capacitance of the tunable component has a second numerical resolution that is finer than the first numerical resolution.

10. The method of claim 1, wherein generating a modified tuning word is performed by a software driver that is distinct from the tunable component.

11. A tunable component comprising:
one or more tunable capacitors, wherein a total capacitance of the one or more tunable capacitors is tunable in response to an electrical tuning input;
a non-volatile memory configured to store a calibration code, wherein the calibration code characterizes a deviation of a capacitance of the one or more tunable capacitors relative to a desired response of the one or more tunable capacitors to a reference electrical tuning input; and
a logic block in communication with the non-volatile memory and the one or more tunable capacitors, wherein the logic block is configured to receive during operation of the tunable component an electrical tuning input as a tuning word corresponding to a desired total capacitance, to generate a modified tuning word that is selected based on the electrical tuning input and the calibration code, and to apply the modified tuning word to change the capacitance of the one or more tunable capacitors to produce a tuned capacitance of the one or more tunable capacitors that most closely matches the desired total capacitance.

12. The tunable component of claim 11, wherein the non-volatile memory is configured to store one of a plurality of bin identifiers that are each associated with a discrete device response range of the one or more tunable capacitors.

13. The tunable component of claim 11, wherein the non-volatile memory is configured to store one or more coefficients of a calibration tuning function.

14. The tunable component of claim 11, wherein the non-volatile memory is configured to store one of a plurality of bin identifiers that are each associated with a discrete device response range of the one or more tunable capacitors; and
wherein the logic block is configured to select one or more of a plurality of tuning words corresponding to the stored one of the plurality of bin identifiers.

15. The tunable component of claim 11, wherein the desired total capacitance has a first numerical resolution; and
wherein the one or more tunable elements are configured to generate a tuned capacitance having a second numerical resolution that is finer than the first numerical resolution.

* * * * *